United States Patent
Taufique et al.

(10) Patent No.: US 6,240,024 B1
(45) Date of Patent: May 29, 2001

(54) METHOD AND APPARATUS FOR GENERATING AN ECHO CLOCK IN A MEMORY

(75) Inventors: Mohammed H. Taufique; Dong-Sun Min; Hemanshu T. Vernenker, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/546,022

(22) Filed: Apr. 10, 2000

(51) Int. Cl.$^7$ ............................................. G11C 7/00
(52) U.S. Cl. ................ 365/189.05; 365/233; 365/230.08
(58) Field of Search .......................... 365/189.05, 230.08, 365/233

(56) References Cited

U.S. PATENT DOCUMENTS

| | | | |
|---|---|---|---|
| 5,838,630 | * 11/1998 | Okajima | 365/233 |
| 5,920,511 | * 7/1999 | Lee et al. | 365/189.05 |
| 5,986,948 | 11/1999 | Cloud | 365/193 |

* cited by examiner

Primary Examiner—Huan Hoang
(74) Attorney, Agent, or Firm—James L. Clingan, Jr.

(57) ABSTRACT

A method and apparatus for generating an echo clock is described. An echo clock is an output strobe signal that selectively follows an input clock signal in a synchronous memory system and indicates when valid output data is available. The same clock signals used to change the state of an echo clock are used to output data from a memory buffer. The data buffer and echo clock buffer/generator are substantially identical in construction and operation, thereby ensuring a close correlation between a change in state of the echo clock and the availability of valid data. Such a memory provides matching of the echo clock transitions with that of the data signals on the data lines of the memory for any frequency range.

20 Claims, 6 Drawing Sheets

METHOD AND APPARATUS FOR GENERATING AN ECHO CLOCK IN A MEMORY

FIELD OF THE INVENTION

The present invention relates generally to memory circuits, and more particularly to methods and apparatus used to read data stored in memory circuits.

BACKGROUND

Advances in microprocessor and other technologies have greatly increased the speeds at which computers can operate, and faster computer processors require faster memories to take advantage of the increased speed. In order to increase memory speed, some memories employ an echo clock or data strobe which follows an input clock signal to speed the reading of data from memory. The echo clock signal speeds the reading of data from the data output lines of a memory circuit by allowing a microprocessor, or other external circuit, to read the data from the output lines as soon as it is valid, instead of waiting a specified period of time.

Because echo clocks are relied upon by a processor or other external circuitry to indicate valid data, one must ensure that the echo clock does not prematurely indicate valid data. Conversely, if the echo clock is delayed for too long a period of time in order to ensure that the data is valid, a less than optimal increase in data retrieval speed will be realized. Therefore, it is essential to match the echo clock as closely as possible to the memory input clock, which triggers the release of data from the memory circuit.

One method of matching an echo clock to the memory input clock involves the use of phase locked loop (PLL) circuits. PLLs are used to generate an echo clock that is synchronized with the memory input clock. However, since PLLs are designed to operate at specific frequencies, echo clocks generated by PLLs are able to lock the echo clock with the input clock only for a particular frequency range. Additionally, given the very tight timing tolerances used in today's processors and memory devices, it can be difficult to match a PLL generated echo clock to the precise time at which valid data is available at each and every memory buffer. That is to say, although a PLL generated echo clock may closely match the time at which valid data is available from a particular memory buffer, the echo clock may not so closely match the time at which valid data is available at other memory buffers. In addition, PLLs are relatively complicated circuits, and can be costly to design and manufacture.

BRIEF DESCRIPTION OF THE DRAWINGS

The embodiments of the present invention discussed hereinafter may be better understood by referencing the accompanying drawings. The use of the same reference symbols in different drawings indicates similar or identical items.

DETAILED DESCRIPTION

The following discussion and the attached drawings which form a part hereof are intended to show by way of illustration at least one example of the invention and should not be taken to be limiting of the invention itself. Rather, any number of variations may fall within the scope of the invention which is properly defined in the claims following this description.

In one embodiment of the invention described herein, a memory includes a memory array, a data buffer, and an echo clock buffer. The data buffer is coupled to receive true and complement data from the memory array at true and complement data inputs of the data buffer and to receive an internal memory clock at a clock input of the data buffer, and coupled to provide buffered data. The echo clock buffer is coupled to receive a logic true signal and a logic complement signal at true and complement data inputs of the echo clock buffer and to receive the internal memory clock at a clock input of the echo clock buffer, and coupled to provide an echo clock to indicate when the buffered data is valid, wherein the data and echo clock buffers are of substantially the same type of buffer. An advantage of such an exemplary memory is that data held in the data buffer can be accessed quickly, because similar signal paths are used to release data from the data buffer as are used to change the state of the echo clock.

Figure 1:
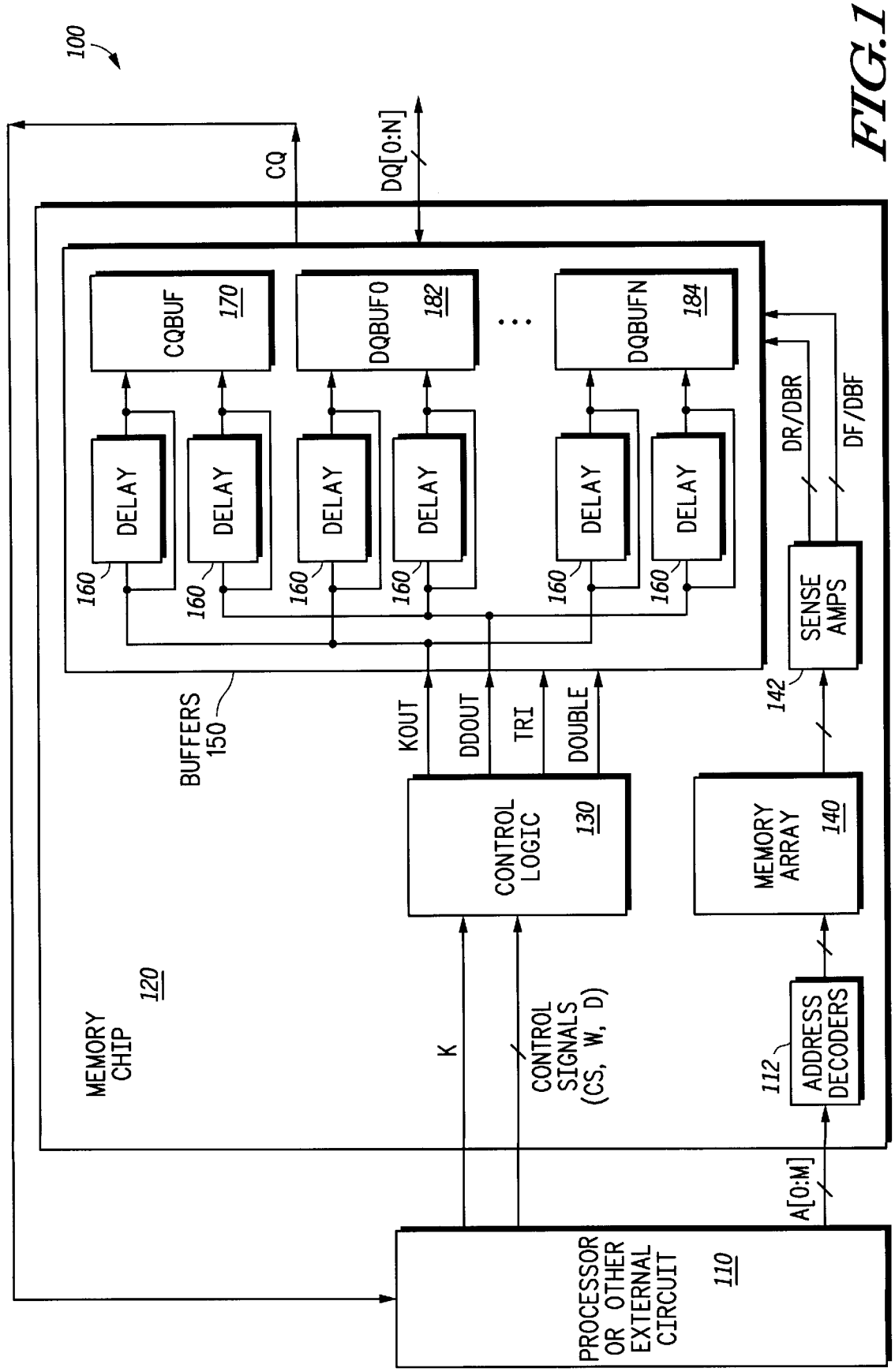
FIG. 1 is a block diagram of an information handling system including an external circuit and a memory circuit (including relevant input and output signals), according to one embodiment of the present invention.

Referring first to FIG. 1, an information handling system is illustrated and designated generally by reference numeral 100. Information handling system 100 includes external circuit 110 and memory circuit 120. (A circuit may be, for example, an integrated circuit, a circuit constructed from discrete components, a soft circuit including various soft modules for representing an integrated circuit, etc.) In one embodiment, external circuit 110 may include one or more microprocessors such as those used in personal computers, mobile telephony devices, and other information handling systems. In other embodiments, external circuit 110 may include one or more individual circuits used to supply memory address requests, clock signals, and/or additional control signals. In one embodiment, memory circuit 120 is a double data rate (DDR) synchronous static random access memory (SRAM), but may be any type of memory employing an echo clock. In at least one embodiment, memory circuit 120 includes address decoders 112, memory array 140, sense amps 142, data buffers DQBUF0 182 through DQBUFN 184, echo clock buffer CQBUF170 and control logic 130. At least one embodiment also employs optional delays 160.

External circuit 110 is coupled to memory circuit 120 to deliver a desired memory address to address decoder 112, as well as system clock signal K and other control signals to control logic unit 130. Address decoders 112 receive the memory address provided by external circuit 110, decode the address, and forward the decoded address to memory array 140. Memory array 140 provides the contents of the desired memory address to data buffers DQBUF0 182 through DQBUFN 184 through sense amps 142.

Control logic unit 130 receives system clock K and control signals from external circuit 110, and generates clocks KOUT and DDOUT, in addition to signals TRI and DOUBLE. These signals are provided to CQBUF 170 to generate echo clock CQ, and to DQBUF0 182 through DQBUFN 184 to release data being held therein. Signal DOUBLE is used by data buffers DQBUF0 182 through DQBUFN 184 to control DDR functionality of memory circuit 120 by setting either a double read operation or a single read operation. During a double read operation, data from a first memory address is output from data buffers DQBUF0 182 through DQBUFN 184 during a first half of the system clock cycle K, and data from a second memory address is output during the second half of system clock cycle K. Note that KOUT and DDOUT are used to trigger both the release of data from data buffers DQBUF0 182 through DQBUFN 184, and to trigger a change in state of the output of CQBUF 170. The output of CQBUF 170 is echo clock CQ, so echo clock CQ is effectively synchronized with the data released from data buffers DQBUF0 182 through DQBUFN 184, thereby providing substantially no delay between the time echo clock CQ indicates valid data, and the availability of that data.

In at least one embodiment, optional delays 160 may be provided on the input path of KOUT and DDOUT into CQBUF 170, DQBUF0 182, and DQBUFN 184 to provide the ability to adjust the timing relationship between KOUT and DDOUT for different buffers. For example, if KOUT and DDOUT must propagate a significantly longer distance to reach CQBUF 170 than the distance propagated to reach DQBUFN 184, then optional delays 160 can be adjusted to equalize the propagation delays. Optional delays 160 may be implemented in any manner known to those skilled in the art. Optional delays 160 may be implemented using multiple pairs of inverters, or by other methods known to those skilled in the art.

Figure 2:
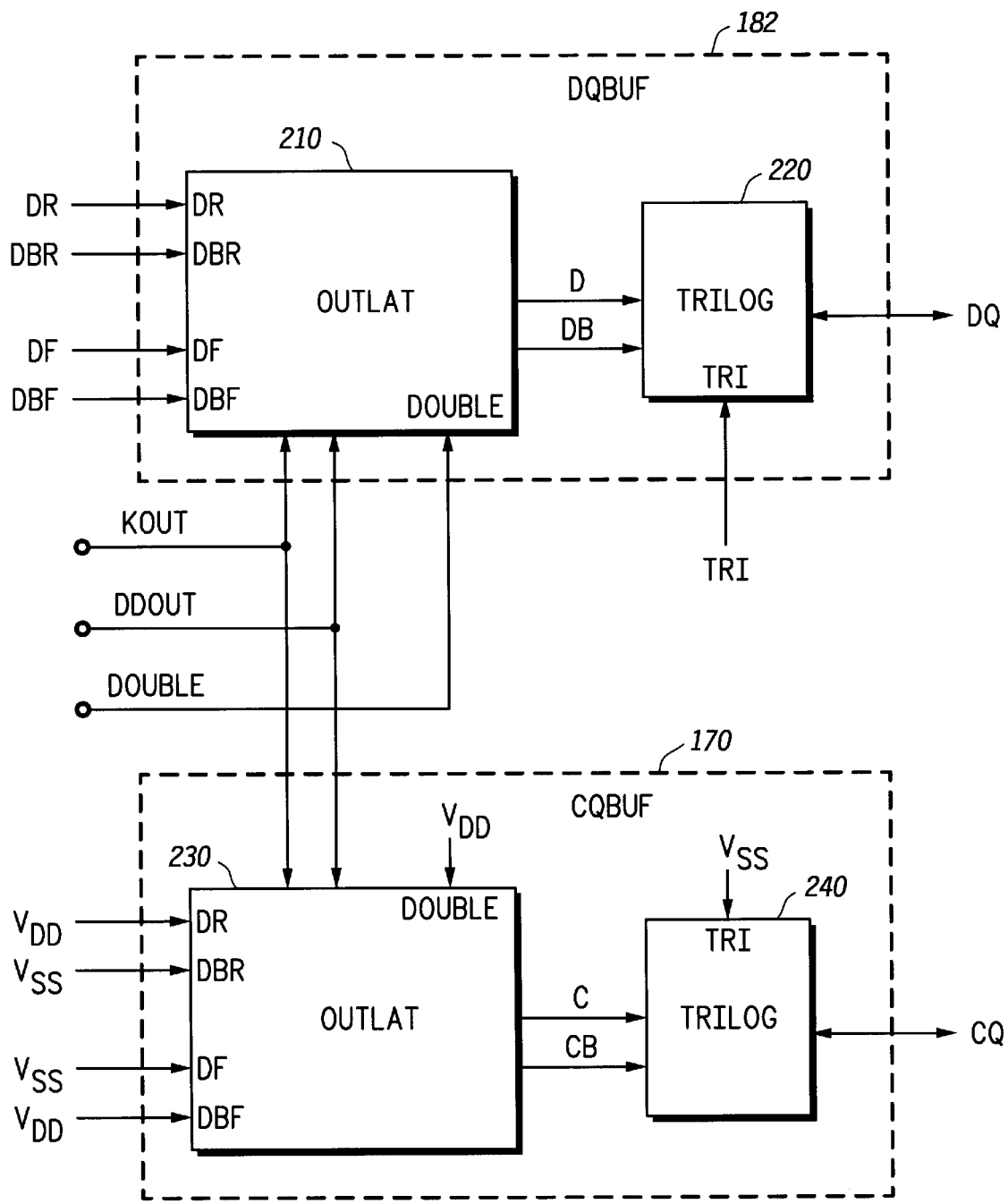
FIG. 2 is a block diagram of the data and echo clock buffers shown in FIG. 1.

Referring next to FIG. 2, a block diagram illustrating one embodiment of DQBUF0 182 and CQBUF 170 will be discussed. DQBUF0 182 is a data buffer configured to receive data DR, DBR, DF and DBF, and to output data DQ in response to signals KOUT, DDOUT and DOUBLE. DR represents data from a first memory address that will be output when the system clock rises from a low value to a high value, and DF represents data from a second memory address that will be output during a double read operation when the system clock falls from a high value to a low value. DBR and DBF are the complements of DR and DF, respectively. It will be appreciated by those skilled in the art that an event timed to occur concurrently with a rise in a clock signal may be timed to occur concurrently with a fall in that clock signal (or vice-versa) without departing from the principles of the present invention.

In one embodiment, double readout operation is enabled when signal DOUBLE is high, and disabled when DOUBLE is low. It will be appreciated that signal values for enabling/disabling double readout operation may be reversed, for example. During a double read operation, KOUT triggers outlat 210 to output DR and DBR to trilog 220, which in turn outputs DR as data-out DQ. KOUT is configured to fire when the system clock rises. During a double read operation, DDOUT triggers outlat 210 to output DF and DBF to trilog 220 when the system clock falls. This causes trilog 220 to output DF as DQ during the second half of the system clock cycle. When double readout operation is disabled, outlat 210 does not provide DF and DBF to trilog 220 in response to DDOUT. As a result, DQBUF0 outputs DR as DQ for the entire system clock cycle. The signal TRI is used to disable read operations while writing data to DQBUF0 182.

CQBUF 170 includes outlat 230 and trilog 240, which perform the same functions as outlat 210 and trilog 220, but inputs DR, DBR, DF, DBF, TRI and DOUBLE are tied to fixed voltages. Tying DOUBLE to VDD ensures that CQBUF remains enabled for double readout operation. Tying DR and DBF to VDD, and tying DBR and DF to VSS, ensures that a data high value is always output as CQ during the first half of a system clock cycle, and a data low value is always output as CQ during the second half of a system clock cycle. This results in an echo clock signal CQ that is synchronized to maintain a given delay from the rise of the system clock, with the same delay from the fall of the system clock. TRI is also may be tied to VSS, thereby causing echo clock CQ to be generated even during write operations. Those skilled in the art will recognize that echo clock CQ may be disable during write operations if desired, without departing from the principles of the present invention.

Figure 3:
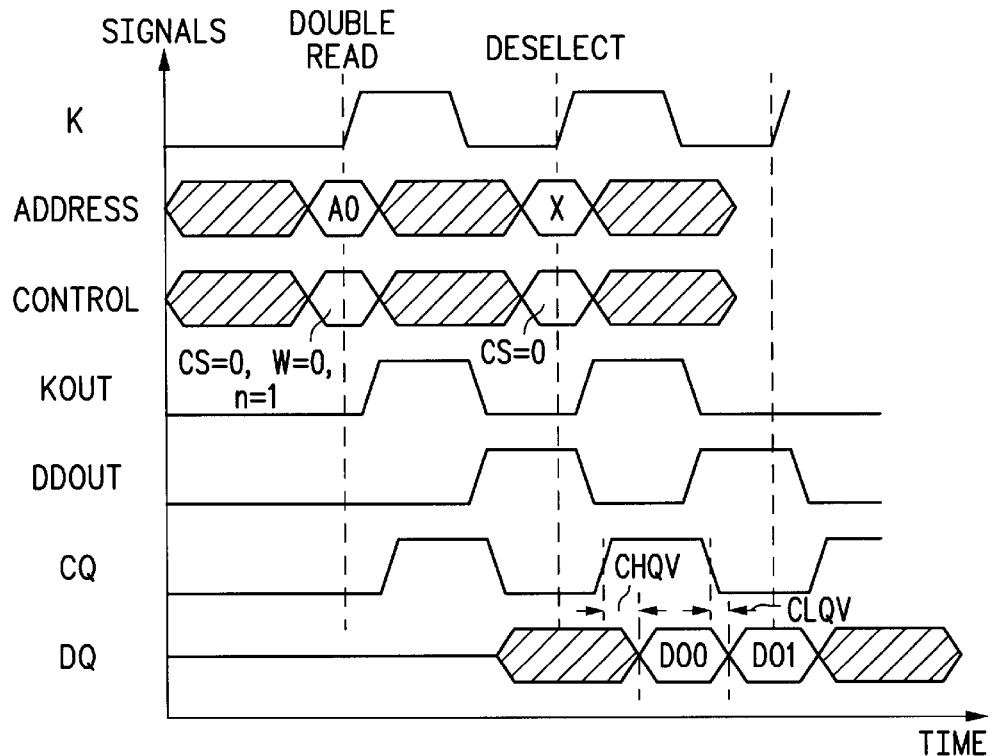
FIG. 3 is a timing diagram illustrating a double read operation in a double data rate static random access memory (SRAM)

Referring next to FIG. 3, in conjunction with FIG. 1, the timing relationship between system clock K, KOUT, DDOUT, echo clock CQ and data output DQ will be discussed. KOUT is a pulse like signal that goes high at the rising edge of K though here is a slight delay because of propagation time of input clock buffer and pulse generation circuitry. DDOUT is a pulse like signal that goes high off the falling edge of K, though again there is a slight delay due to propagation time of input clock buffers and pulse generation circuitry.

Beginning with K, note that as the first pulse of K goes high, address A0 and a subsequent memory address are loaded into memory array 140 which in turn provides the contents of both memory addresses to data buffers DQBUF0182. Before the next pulse of K goes high, memory array 140 and sense amps 142 have completed their operations and the data from the memory locations is waiting at the inputs DR, DF, DBR and DBF of the data buffers DQBUF0182. At the rise of the second pulse of K, KOUT begins to go high and triggers data buffer DQBUF0182 to output DO0 which is the data from address A0 and which corresponds to input DR of DQBUF0 182. When the second pulse of K falls to a low value, DQBUF0 182 outputs DO1, which is data from the subsequent memory location and which corresponds to input DF of DQBUF0 182. Note that KOUT and DDOUT trigger the rise and fall of echo clock CQ from CQBUF 170 at substantially the same time they trigger the release of data from DQBUF0 182. As a result, the rise and fall of echo clock CQ (which indicates the presence of valid data) corresponds very closely to the first and second data outputs from DQBUF0 182.

As shown in FIG. 3, there is some difference CHQV and CLQV between CQ transitions and data transitions due to process limitations and routing differences. In one embodiment, a simulation using a 0.18 micron high performance CMOS process resulting in CHQV value of 20 picoseconds. In a related silicon embodiment, a CHQV value was 70 picoseconds. Thus, the circuits discussed herein provide for an extremely close match, and indeed, are substantially equal, given the process imitations of the medium of a given circuit. The difference between echo clock transitions and data transitions is therefore minimized over more conventional circuits.

Figure 4:
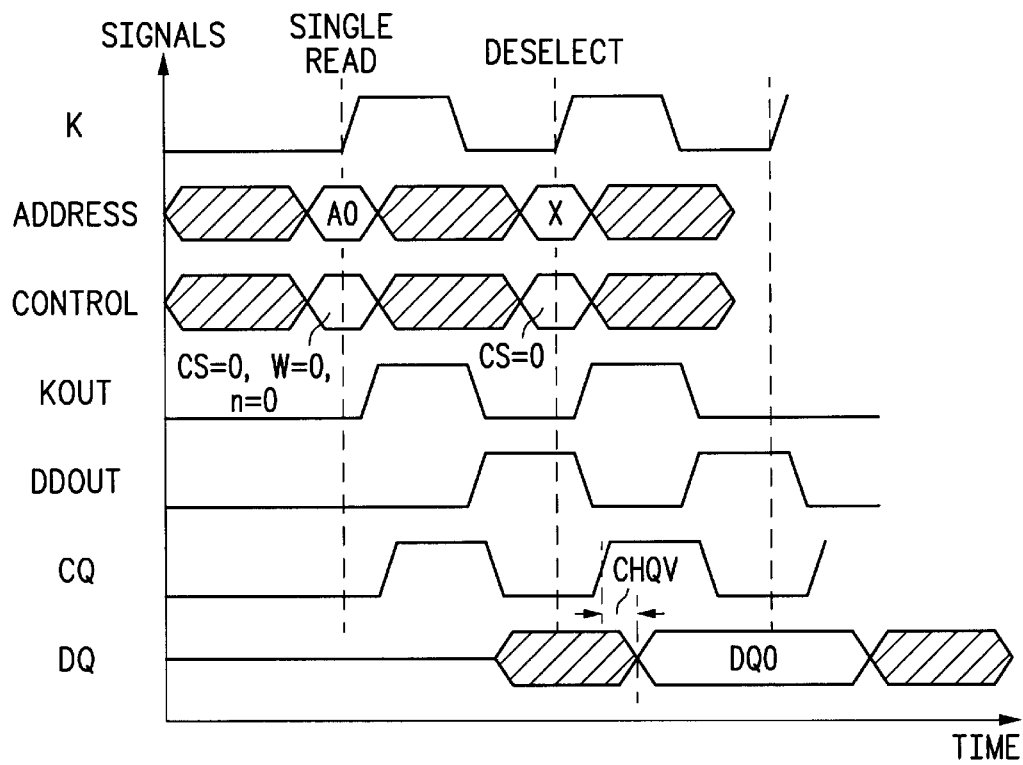
FIG. 4 is a timing diagram of a single read operation in a double data rate SRAM.

Referring next to FIGS. 4 and 1, a timing diagram illustrating a single read operation in a double data rate memory, such as a static random access memory (SRAM) is illustrated. All timing elements in the single read operation illustrated in FIG. 4 are identical to the timing elements illustrated in the double read operation described with reference to FIG. 3, except that the DQBUF0 182 is inhibited from outputting DQ1 when echo clock CQ drops low. It will be appreciated that since inhibiting the double read operation is simply a matter of supplying an appropriate value of DOUBLE, a memory constructed according the principles of at least one embodiment of the present invention can operate in double read operation and switch to single read operation (and vice-versa) within a single clock cycle.

Figure 5:
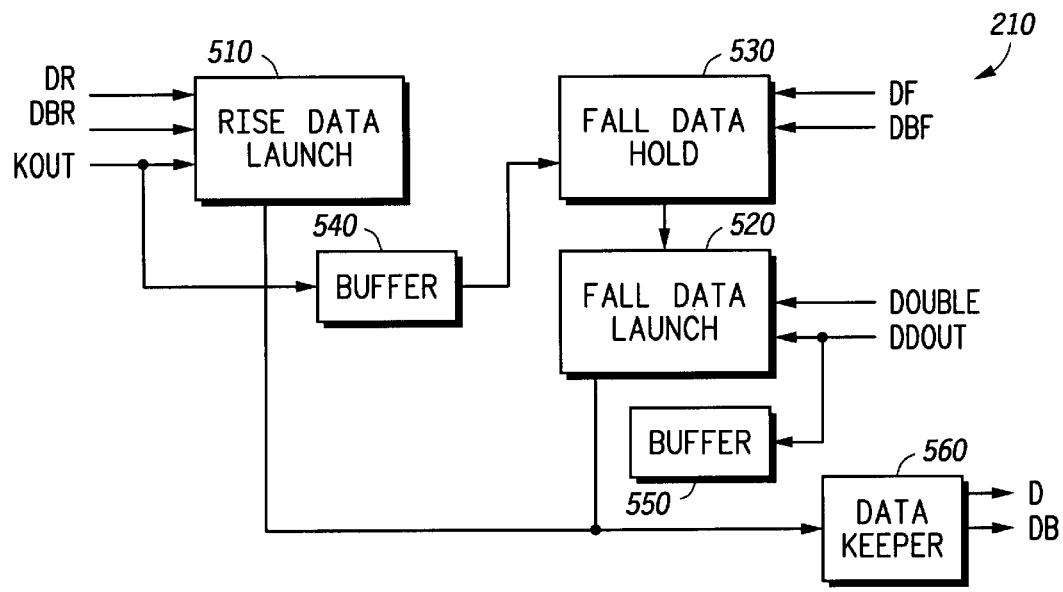
FIG. 5 is a simplified block diagram of the output latch of the output data buffer shown in FIG. 2.

Referring now to FIG. 5, an output latch is illustrated according to one embodiment of the present invention, and designated generally by reference numeral 210. Outlat 210 includes rise data launch 510, fall data hold 530, load buffer 540, fall data launch 520, load buffer 550, and data keeper 560. For illustrative purposes, outlat 210 will be assumed to be enabled for double read operation. When DR and DBR (which represent data from a first memory address and that data's complement) are held ready at the input to rise data launch 510, DF and DBF (representing data from a second memory address and that data's complement) are held ready at fall hold data 210. Rise data launch 510 supplies DR and DBR to data keeper 560 in response to KOUT. KOUT also causes fall data hold circuit 530 to provide DF and DBF to fall data launch 520. Note that DF and DBF are now held ready at the input of fall data launch 520, but are not output to data keeper 560. DF and DBF are only released to data keeper 560 if double readout operation is enabled by DOUBLE, and in response to DDOUT. Since KOUT and DDOUT correspond to the rising edge and falling edge of the system clock K (FIG. 1), respectively, DR and DBR are output by data keeper 560 during the first half of the system clock cycle, while DF and DBF are provided by data keeper 560 during the second half of the system clock cycle.

Because the time at which KOUT reaches rise data launch 510 is relatively critical, load buffer 540 is provided to limit the load seen by KOUT. Load buffer 540 introduces an additional delay in KOUT before reaching fall data hold circuit 530, but this delay is not critical since fall data hold is not actually releasing data for output, but merely providing an input to fall data launch 520. Load buffer 550 matches the input load seen by DDOUT with the input load seen by KOUT. By matching the loads, KOUT and DDOUT can maintain a fixed timing relationship to each other, and to system clock K (FIG. 1).

Note that the critical path for DR and DBR (data to be output during the first part of a double read operation) passes from rise data launch 510 through data keeper 560, and that the critical path for DF and DBF (data to be output during the second part of a double read operation) passes from fall data launch 520 through data keeper 560. Fall data hold circuit 530 is not part of the critical path of DF and DBF, because fall data hold circuit 530 merely prepares and holds DF and DBF ready for fall data launch 520. Note that outlat 210 (FIG. 2) is substantially identical to outlat 230 (FIG. 2), which is used in generating echo clock CQ (FIG. 2).

Figure 6:
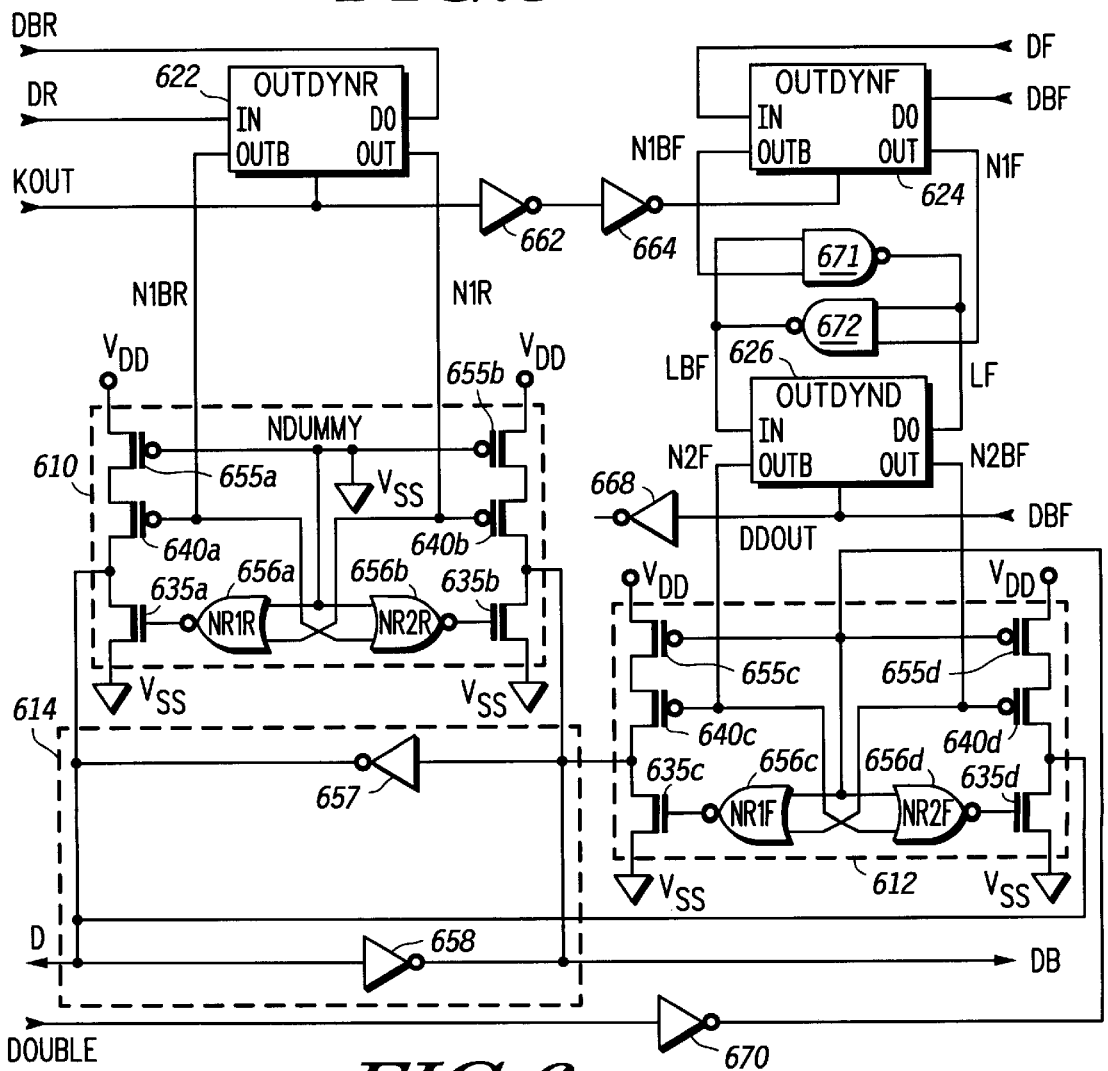
FIG. 6 is a schematic diagram of an output latch illustrating the critical paths taken by data and an echo clock.

Referring next to FIG. 6, observe the symmetry of the circuit with respect to rising edge data DR and DBR (fired off of KOUT) and falling edge data DF and DBF (fired off of DDOUT). The left half of the circuit is the data path for DR and DBR (data off the rising edge of KOUT), while the right half of the circuit is the data path of DF and DBF (data off the rising edge of DDOUT). Note that DR, DBR, DF and DBF are available before the rising edge of KOUT. In FIG. 6, OUTDYNR 622, OUTDYNF 624 and OUTDYND 626 are identical dynamic latches.

Consider the left half of the circuit first. Dynamic latch OUTDYNR 622 is a circuit that latches the data at the rising edge of its clock KOUT. While KOUT is high the OUT-DYNR 622 is in the evaluating phase, and N1BR and N1R reflect the latched data (DR and DBR) in OUTDYNR 622. While KOUT is low, the OUTDYNR 622 is in the precharge phase and both outputs N1BR and N1R are high. Transistors 655a, 655b, 640a, 640b, 635a, 635b, gate 656a and gate 656b form a static latch 610 that is used to convert signals N1R and N1BR from half cycle signals to full cycle signals. When KOUT is high, N1R and N1BR are complements of each other, and N1R and N1BR are transmitted to outputs D and DB. When KOUT is low, both N1R and N1BR are high, and transistors 655a, 655b, 640a, 640b, 635a, 635b will all be off. D and DB retain their state due to back to back inverters 657 and 658 which form latch 614.

Now considering the right half of the circuit, dynamic latch OUTDYNF latches DF and DBF on the rising edge of KOUT. Inverters 662 and 664 are added as a buffer stage so as not to load the critical signal KOUT. Command gates 671 and 672 convert signals N1F and N1BF from half cycle signals to full cycle signals. Dynamic latch OUTDYND 626 then latches N1F and N1BF on the rising edge of DDOUT. Inverter 668 is a dummy load added to mimic the loading of 662 on KOUT so that the loading on KOUT and DDOUT are matched.

Transistors 655c, 655d, 640c, 640d, 635c, 635d, gate 656c and gate 656d form a static latch 612 that functions in a similar manner as latch 610 formed by transistors 655a, 655b, 640a, 640b, 635a, 635b, gate 656a and gate 656b. The only difference is the additional input signal DOUBLE. If DOUBLE is low, indicating that the current operation is not a double read operation, then transistors 655c, 655d, 635c and 635d are turned off and the inputs N2F and N2FB (representing DF and DBF) are not allowed to propagate through. Thus there will be no new data at the rising edge of DDOUT which, is consistent with the requirement that the current operation is not a double read.

If DOUBLE is high, however, the latch 612 operates in exactly the same manner as latch 610. The use of P channel transistors 655a and 655b in the left side latching circuit 610 can now be appreciated. "Dummy" transistors 655a and 655b are provided in the right side latch circuit 610 to match the "double" transistors 655c and 655d in the left side latch circuit 612. Transistors are sized in order to match rising and falling edges of the data.

The pulse widths of KOUT and DDOUT are smaller than half of the period of system clock K (FIG. 1). This ensures that there is no overlap between KOUT and DDOUT pulses. If there was an overlap, then during a double read operation both the left and right side latches would try to simultaneously drive latch 614 during the period of overlap. Special attention is also given to the layout of the circuit to make sure that the left half and right half of the circuit shown in FIG. 6 are substantially symmetrical. Because of this, DR/DBR and DF/DBF are matched for both rising and falling edges of the system clock K (FIG. 1) under all process temperature and bias conditions.

Referring again to FIG. 2, according to one embodiment of the present invention, outlat 230 used in the echo clock buffer CQBUF 170 is substantially identical to outlat 210 used in the data buffer DQBUF0 182. In the case of the CQBUF 170, however, some of the inputs are hardwired to VDD or VSS. Hardwiring DR to VDD and DF to VSS results in CQ always going high on the rising edge of KOUT and low on the rising edge of DDOUT. In effect, the echo clock CQ follows the input clock. Because the back end of the data path and the echo clock path are identical, a very close match is obtained between the transitioning of the data lines and the echo clock.

Figure 7:
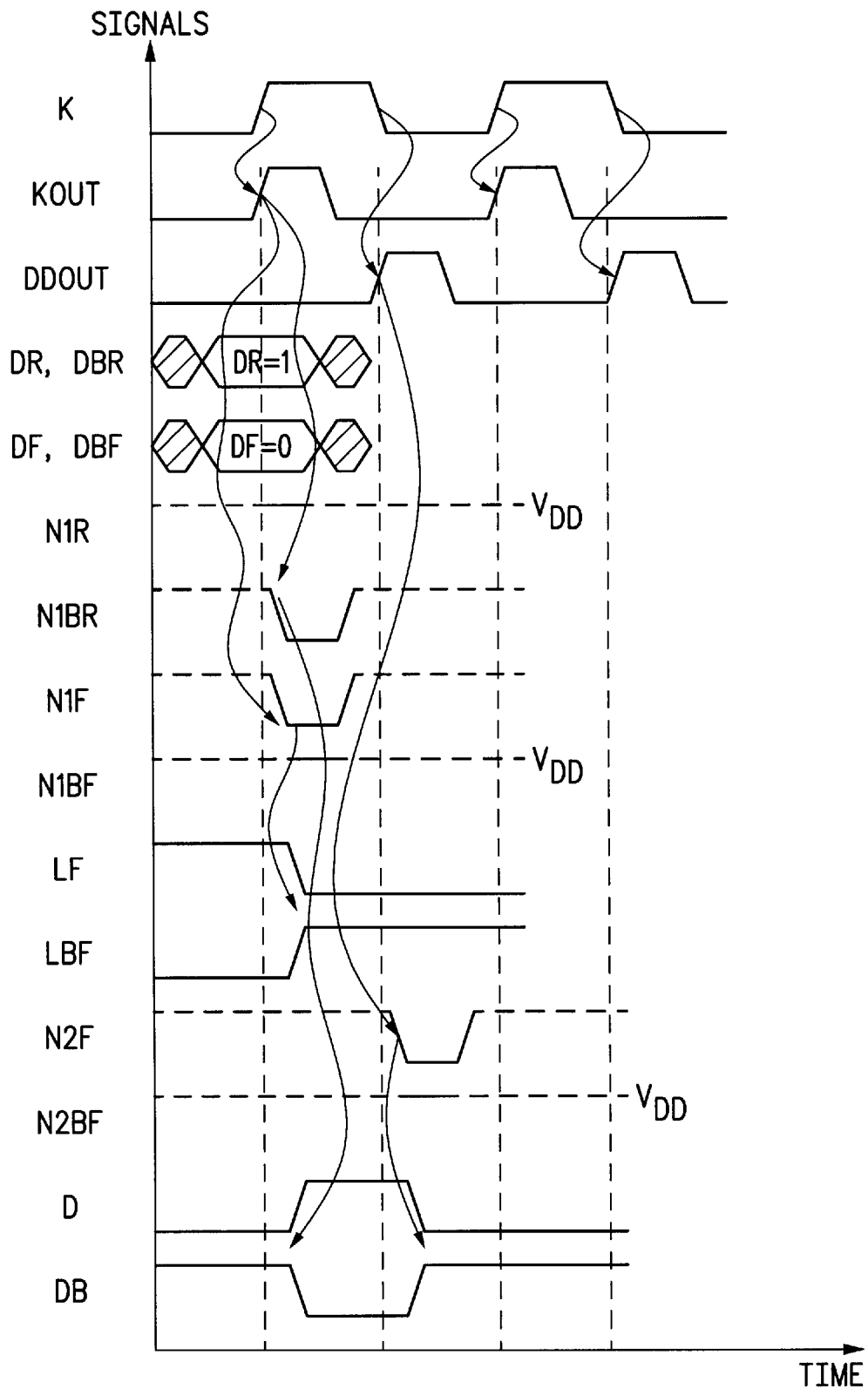
FIG. 7 is a timing diagram illustrating the timing relationships within an output latch.

Referring next to FIG. 7, a timing diagram according to one embodiment of the present invention is provided. Additional reference to FIG. 6 may assist the reader in understanding this timing diagram. K is the main system clock. A number of events occur as the first pulse of system clock K rises. As shown, the rising edge of KOUT substantially coincides with the rising edge of system clock K, and the rising edge of DDOUT substantially coincides with the falling edge of system clock K. DR and its complement DBR, as well as DF and its complement DBF, are provided as inputs to dynamic latches OUTDYNR 622 and OUTDYNF 624. KOUT goes high a short time after system clock K rises. In this example, DR (the data to be output during the first part of a double read operation) has a logic high value (represented by a 1), and DF (the data to be output during the second part of a double read operation) has a logic low value (represented by a 0). For the given inputs DR and DBR, N1R (the output of dynamic latch OUTDYNR 622) is high, and N1BR (the complement on N1R) is low during the time KOUT is high. This is shown in FIG. 7 by the solid lines of N1R and N1BR. When KOUT is low, both N1R and N1BR are held high, which is shown by the dotted lines of N1R and N1BR. Memory outputs D and DB correspond to N1R and N1BR during the first part of a double read operation, and to N2F and N2BF during the second part of a double read operation. Consequently, when N1R is high and N1BR is low during the first part of a double read operation, D is high and DB is low.

In a similar manner, N1F and N1BF assume the values of DF and DBF only during the time KOUT remains high. N1F and N1BF serve as inputs to command gates 671 and 672, which produce signals LF and LBF correspond to input signals DF and DBF. In this example, since DF is low (represented by a 0) and DBF (the complement of DF) is high (represented by a 1), LF is low and LBF is high after KOUT goes high, and remain in that state until changed in response to another KOUT pulse. When system clock K drops low, DDOUT goes high, and puts N2F (a low in this example) and N2BF (a high) onto outputs D and DB respectively.

The timing diagram illustrated in FIG. 7 illustrates the timing of a portion of a data buffer (such as DQBUF0 182 in FIG. 2) when data buffer input DR is high and data buffer input DF is low. The same timing diagram can be used to illustrate the function of an echo clock buffer (such as CQBUF 170 in FIG. 2) with input DR tied to a voltage representing a data high, and input DF tied to a voltage representing a data low. By keeping in mind that the same timing diagram holds for both DQBUF0 182 and CQBUF 170, one will appreciate that the state changes in echo clock CQ (FIG .3) will very closely match the time valid data is output from DQBUF0 182 (FIG. 2).

Figure 8:
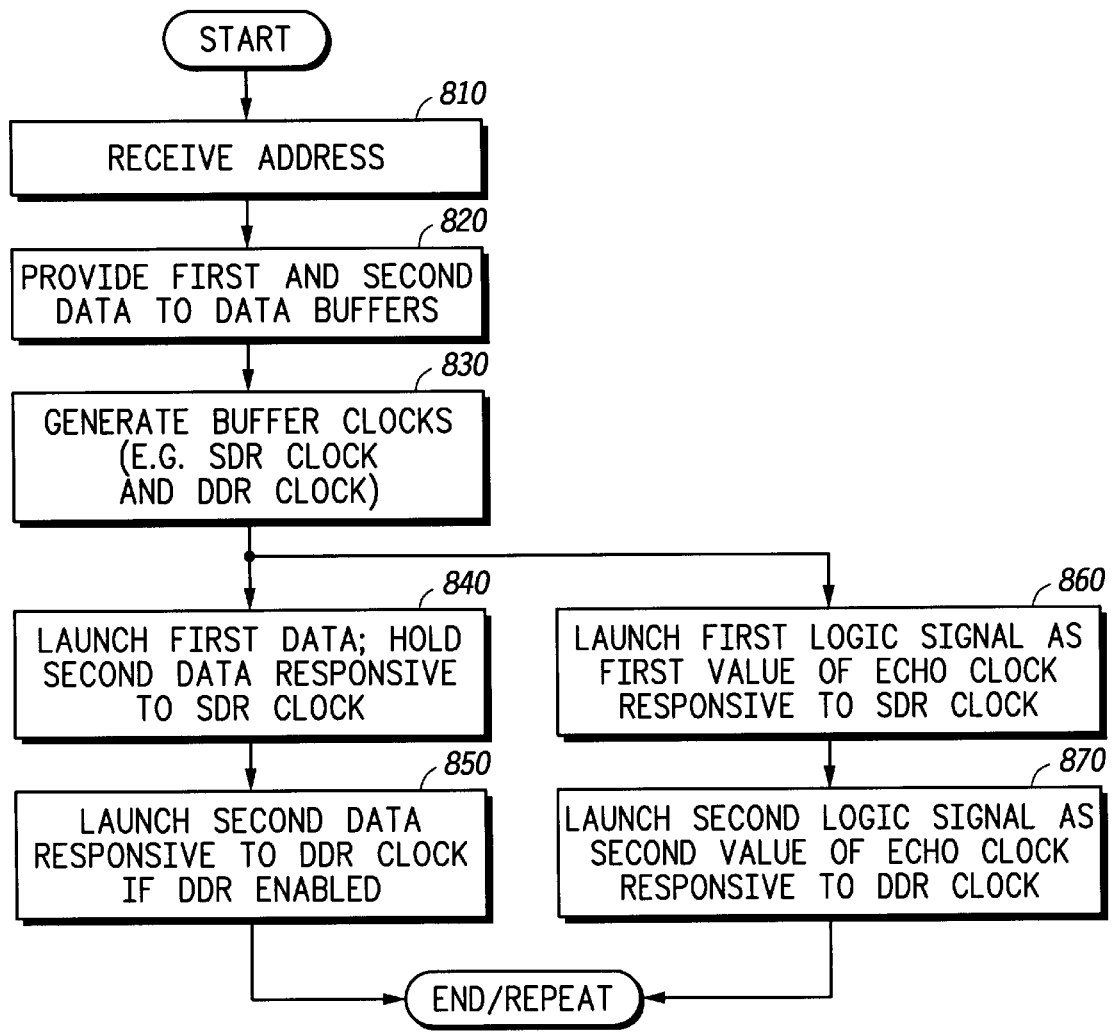
FIG. 8 is a flow chart illustrating a method according to at least one embodiment of the present invention.

Referring next to FIG. 8, a method according to the present invention is illustrated. FIG. 1 and FIG. 2 can be reviewed for hardware references made in discussing the method illustrated in FIG. 8. The method in FIG. 8 begins at step 810 in which external circuit 110 as illustrated in FIG. 1 or other external circuit provides a set of addresses from which memory data is to be retrieved. Upon receipt of the address in step 810, memory array 140 provides first data and second data to data buffers, such as DQBUF0 182, in step 820. Referring to FIG. 2 and using the DQBUF0 182 as an example, note that the first data includes DR and its complement DBR, while the second data includes DF and its complement DBF.

After the first and second data are available as inputs to DQBUF0 182 as illustrated in FIG. 1, control logic 130 generates two clock signals, the single data read (SDR) clock and the double data read (DDR) clock. The SDR clock and the DDR clock are designated KOUT and DDOUT in FIGS. 1 and 2. At this point, steps 840 and 860 are performed simultaneously. In step 840, the first data is launched and the second data is held for transmission during a second half of a double read operation. In addition, the first value of echo clock CQ, as illustrated in FIG. 2, is launched. Both steps 840 and 860 are performed in response to the SDR clock (KOUT).

Following steps 840 and 860, steps 850 and 870 are performed simultaneously. In step 850, the second data (DF and DBF) are launched if double data read operation is enabled. In the event that double data read operation is not enabled, DQBUF0 182 knows that a single read operation is being performed, and the second data (DF and DBF), are not launched. At the same time that the second data is launched from the DQBUF0 182, if at all, the second value of the echo clock CQ is launched in step 870. Both the second value of the echo clock CQ and the second data are triggered by the same clock, DDOUT.

While particular embodiments of the present invention have been shown and described, it will be obvious to those skilled in the art that, based upon the teachings herein, various modifications, alternative constructions, and equivalents may be used without departing from the invention claimed herein. Consequently, the appended claims encompass within their scope all such changes, modifications, etc. as are within the true spirit and scope of the invention.

Furthermore, it is to be understood that the invention is solely defined by the appended claims. The above description is not intended to present an exhaustive list of embodiments of the invention. Unless expressly stated otherwise, each example presented herein is a nonlimiting or nonexclusive example, whether or not the terms nonlimiting, nonexclusive or similar terms are contemporaneously expressed with each example. Moreover, mention of one feature of an embodiment discussed herein as being optional by no means implies that another feature of an embodiment discussed herein is necessary.

Because the above detailed description is exemplary, when "one embodiment" is described, it is an exemplary embodiment. Accordingly, the use of the word "one" in this context is not intended to indicate that one and only one embodiment may have a described feature. Rather, many other embodiments may, and often do, have the described feature of the exemplary "one embodiment." As used above, when the invention is described in the context of one embodiment, that one embodiment is one of many possible embodiments of the invention.

Notwithstanding the above caveat regarding the use of the words "one embodiment" in the detailed description, it will be understood by those within the art that if a specific number of an introduced claim element is intended, such an intent will be explicitly recited in the claim, and in the absence of such recitation no such limitation is present or intended. For example, in the claims below, when a claim element is described as having "one" feature, it is intended that that element be limited to one and only one of the feature described. Furthermore, when a claim element is described in the claims below as including or comprising "a" feature, it is not intended that the element be limited to one and only one of the feature described. Rather, for example, the claim including "a" feature reads upon an apparatus or method including one or more of the feature in question. That is, because the apparatus or method in question includes a feature, the claim reads on the apparatus or method regardless of whether the apparatus or method includes another such similar feature. This use of the word "a" as a nonlimiting, introductory article to a feature of a claim is adopted herein by Applicants as being identical to the interpretation adopted by many courts in the past, notwithstanding any anomalous or precedential case law to the contrary that may be found.

Similarly, when a claim element is described in the claims below as including or comprising an aforementioned feature (e.g., "the" feature), it is intended that that element not be limited to one and only one of the feature described. Furthermore, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although an attempt has been made to outline some exemplary embodiments and exemplary variations thereto, other embodiments and/or variations are within the scope of the invention as defined in the claims below.

What is claimed is:

1. An apparatus comprising:
   a memory for storing information; and wherein
      a first buffer coupled to receive information from the memory and to provide the information at a first buffer output during a read operation; and
      a second buffer substantially similar to the first buffer, the second buffer being coupled to provide an echo clock to indicate when the information is ready at the first buffer output.

2. The apparatus of claim 1 wherein
   the first and second buffers are coupled to receive a buffer clock and to provide the information and the echo clock responsive to the buffer clock; and
   the second buffer is coupled to provide the echo clock having a transition at a substantially same time as the information is provided by the first buffer for any of a plurality of operating frequencies of the buffer clock.

3. The apparatus of claim 1 wherein the first buffer includes
   a first launch circuit coupled to receive the information and to drive buffered information responsive to a buffer clock; and
   a latch coupled to receive and to store the driven buffered information; and
   the second buffer includes
      a first launch circuit coupled to receive voltage reference signals to drive the echo clock signal responsive to the buffer clock, the first launch circuit of the second buffer being substantially similar to the first launch circuit of the first buffer; and
      a latch coupled to receive and to store the driven echo clock.

4. The apparatus of claim 1 wherein
   the memory is double data rate capable;
   the information is first information;
   the memory is for storing the first information and second information, the memory being coupled to provide the first and second information to the first buffer;
   the first buffer is coupled to provide the first information responsive to a first type edge of an input clock and the second information responsive to a second type edge of the input clock, the second buffer being coupled to receive voltage reference signals at data inputs and to provide the echo clock to indicate when the information is ready at the first buffer output.

5. The apparatus of claim 4 wherein the first buffer comprises:
   a first DDR enable input coupled to receive an enabling signal to enable the first buffer to provide the first information responsive to the first type edge of the input clock; and
   a second DDR enable input coupled to receive a double enable signal to enable and disable the first buffer to provide the second information responsive to the second type edge of the input clock.

6. The apparatus of claim 1 wherein
   the information is first information;
   the memory is a double data rate capable memory for storing the first information and second information, the memory being coupled to provide the first and second information to the first buffer;
   the first buffer is coupled to provide the first information responsive to a first type edge of an input clock and the second information responsive to a second type edge of the input clock; and
   the second buffer is coupled to receive voltage reference signals at data inputs and to provide the echo clock to indicate when the information is ready at the first buffer output.

7. The apparatus of claim 6 wherein the first buffer is coupled to receive a first buffer clock having a first type edge responsive to the first type edge of the input clock and a second buffer clock having a first type edge responsive to the second type edge of the input clock.

8. The apparatus of claim 7 wherein the first type edge is a rising edge and the second type edge is a falling edge.

9. The apparatus of claim 7 wherein the first buffer includes
   a first launch circuit coupled to receive the first information and to drive buffered first information responsive to the first buffer clock;
   a hold circuit coupled to receive the second information and to drive held second information responsive to the first buffer clock;
   a second launch circuit coupled to receive the held second information and to drive buffered second information responsive to the second buffer clock; and
   a latch coupled to sequentially receive and store the first and second buffered information.

10. The apparatus of claim 9 wherein the second buffer includes
    a first launch circuit coupled to receive the voltage reference signals and to drive a first value of the echo clock responsive to the first buffer clock;
    a hold circuit coupled to receive the voltage reference signals and to drive a held value of the echo clock responsive to the first buffer clock;
    a second launch circuit coupled to receive the held value of the echo clock and to drive a second value of the echo clock responsive to the second buffer clock; and
    a latch coupled to sequentially receive and store the first and second values of the echo clock.

11. The apparatus of claim 10 wherein
    the second launch circuit of the first buffer is coupled to drive the buffered second information after the first launch circuit of the first buffer drives the buffered first information; and the second launch circuit of the second buffer is coupled to drive the second value of the echo clock after the first launch circuit of the second buffer drives the first value of the echo clock.

12. The apparatus of claim 10 wherein each hold circuit is coupled to receive the first buffer clock via a first load buffer of the respective first and second buffers;

each of the first and second buffers further includes a second load buffer, the second load buffer being coupled to receive the second buffer clock, the second load buffer being substantially similar to the first load buffer.

13. A method of providing an echo clock to indicate when data output of a memory is valid, the method comprising:

providing first data to first data inputs of a plurality of data buffers of a first buffer type responsive to receiving an address by the memory;

providing voltage reference signals to data inputs of an echo clock buffer of the first buffer type;

providing the first data by the data buffers responsive to a first edge of an input clock; and providing a first edge of the echo clock by the echo clock buffer responsive to the first edge of the input clock.

14. The method of claim 13, further comprising:

providing second data to second data inputs of the plurality of data buffers responsive to receiving the address by the memory;

holding the second data by the data buffers while providing the first data responsive to the first edge of the input clock;

providing the second data by the data buffers responsive to a second edge of the input clock; and providing a second edge of the echo clock by the echo clock buffer responsive to the second edge of the input clock.

15. The method of claim 14, further comprising:

generating a first buffer clock responsive to receiving the input clock, the first buffer clock having a first edge corresponding to the first edge of the input clock, wherein the first data is provided by the data buffers responsive to the first edge of the first buffer clock and the first edge of the echo clock is provided by the echo clock buffer responsive to the first buffer clock; and generating a second buffer clock responsive to receiving the input clock, the second buffer clock having a first edge corresponding to the second edge of the input clock, wherein the second data is provided by the data buffers responsive to the second buffer clock and the second edge of the echo clock is provided by the echo clock buffer responsive to the second buffer clock.

16. The method of claim 14 wherein the first type of edges are rising edges; and the second type of edges are falling edges.

17. A method of generating an echo clock in a synchronous memory, the method comprising:

providing a first buffer circuit coupled to receive data from a memory array and to provide the data dependent upon an input clock; and providing a second buffer circuit coupled to receive logic true and complement signals and to provide an echo clock dependent upon the input clock, the first and second buffer circuits being substantially similar so that the propagation time of the data through the first buffer circuit is substantially equal to the propagation of the logic true and complement signals through the second buffer circuit.

18. The method of claim 17 further comprising:

providing at least one buffer clock to the first and second buffer circuits;

providing the data by the first buffer circuit responsive to the at least one buffer clock;

transitioning the echo clock from a first state to a second state by the second buffer circuit responsive to the at least one buffer clock;

wherein the providing the data and the transitioning the echo clock occur at a substantially the same time.

19. The method of claim 18 wherein the providing the at least one buffer clock comprises:

providing a single data rate (SDR) buffer clock to the first and second buffer circuits, the SDR buffer clock having a first edge dependent on a first edge of the input clock; and providing a double data rate (DDR) buffer clock to the first and second buffer circuits, the DDR buffer clock having a first edge dependent on a second edge of the input clock.

20. A double data rate capable buffer comprising:

a first signal path including a launch stage coupled to receive first information and to provide the first information responsive to a first clock; and an internal buffer coupled to receive the first clock;

a second signal path including a hold stage coupled to receive second information and to provide the second information responsive to the first clock received from the internal buffer; and a launch stage coupled to receive the second information from the hold stage and to provide the second information responsive to a second clock; and a load buffer coupled to receive the second clock, the load buffer having a substantially similar load effect on the second clock as the internal buffer has on the first clock.

* * * * *

UNITED STATES PATENT AND TRADEMARK OFFICE
CERTIFICATE OF CORRECTION

PATENT NO.     : 6,240,024 B1
DATED          : May 29, 2001
INVENTOR(S)    : Mohammed Taufique et al.

It is certified that error appears in the above-identified patent and that said Letters Patent is hereby corrected as shown below:

<u>Column 12,</u>
Line 27, delete "a".

Signed and Sealed this

Second Day of July, 2002

Attest:

Attesting Officer

JAMES E. ROGAN
Director of the United States Patent and Trademark Office